United States Patent
Da Dalt et al.

(10) Patent No.: US 6,970,046 B2
(45) Date of Patent: Nov. 29, 2005

(54) DIGITAL PHASE-LOCKED LOOP

(75) Inventors: Nicola Da Dalt, Villach (AT);
Christoph Sandner, A Villach (AT)

(73) Assignee: Infineon Technologies AG, Munich (DE)

(*) Notice: Subject to any disclaimer, the term of this patent is extended or adjusted under 35 U.S.C. 154(b) by 108 days.

(21) Appl. No.: 10/275,826

(22) PCT Filed: May 8, 2001

(86) PCT No.: PCT/EP01/05227

§ 371 (c)(1),
(2), (4) Date: Jun. 9, 2003

(87) PCT Pub. No.: WO01/86816

PCT Pub. Date: Nov. 15, 2001

(65) Prior Publication Data

US 2005/0077969 A1 Apr. 14, 2005

(30) Foreign Application Priority Data

May 9, 2000 (DE) ......................... 100 22 486

(51) Int. Cl.⁷ ............................................... H03L 7/00
(52) U.S. Cl. ..................... 331/16; 331/1 A; 331/25; 331/17; 327/156; 327/159; 327/160
(58) Field of Search ............................ 331/1 A, 16, 17, 331/25; 327/156, 159, 160; 375/376

(56) References Cited

U.S. PATENT DOCUMENTS

| 4,577,163 | A | | 3/1986 | Culp ........................... 331/109 |
| 5,258,724 | A | | 11/1993 | Tanis et al. .................. 331/1 A |
| 5,727,038 | A | | 3/1998 | May et al. .................... 375/376 |
| 5,739,725 | A | * | 4/1998 | Ferraiolo et al. .............. 331/57 |
| 6,005,425 | A | * | 12/1999 | Cho ............................. 327/156 |
| 6,005,427 | A | | 12/1999 | Morishima .................... 327/159 |
| 6,028,488 | A | | 2/2000 | Landman et al. ............... 331/1 |
| 6,052,034 | A | | 4/2000 | Wang et al. .................... 331/2 |
| 6,664,827 | B2 | * | 12/2003 | O'Leary et al. ............ 327/156 |

FOREIGN PATENT DOCUMENTS

EP          0758171 A2    2/1997    ........... H04L/7/033

OTHER PUBLICATIONS

Y.R. Shayan, et al., *All Digital Phase Locked Loop: Concepts, Design, and Applications*, Feb. 1989, IEE Proceedings, vol. 136, Pt. F. No. 1, pp. 53–56.

Stephen Walters, et al., *Digital Phase–Locked Loop with Jitter Bounded*, Jul. 1989, IEEE Transactions on Circuits and Systems, vol. 36, No. 7, pp. 980–986.

PCT International Search Report of International Application No. PCT/EP 01/05227.

European Examination Report, dated May 4, 2004, 4 pages.

* cited by examiner

*Primary Examiner*—Arnold Kinkead
(74) *Attorney, Agent, or Firm*—Fish & Richardson P.C.

(57) ABSTRACT

A digital phase-locked loop with a digitally controlled oscillator is disclosed. The phase difference between a reference phase and a phase derived from the output phase of the oscillator is determined by a phase detector device and converted into a corresponding digital set value. The digital set value from the phase detector device is fed through a digital filter, to the digitally controlled oscillator, for the corresponding setting of the output phase thereof. By means of the above architecture any digital loop filter may be used.

8 Claims, 3 Drawing Sheets

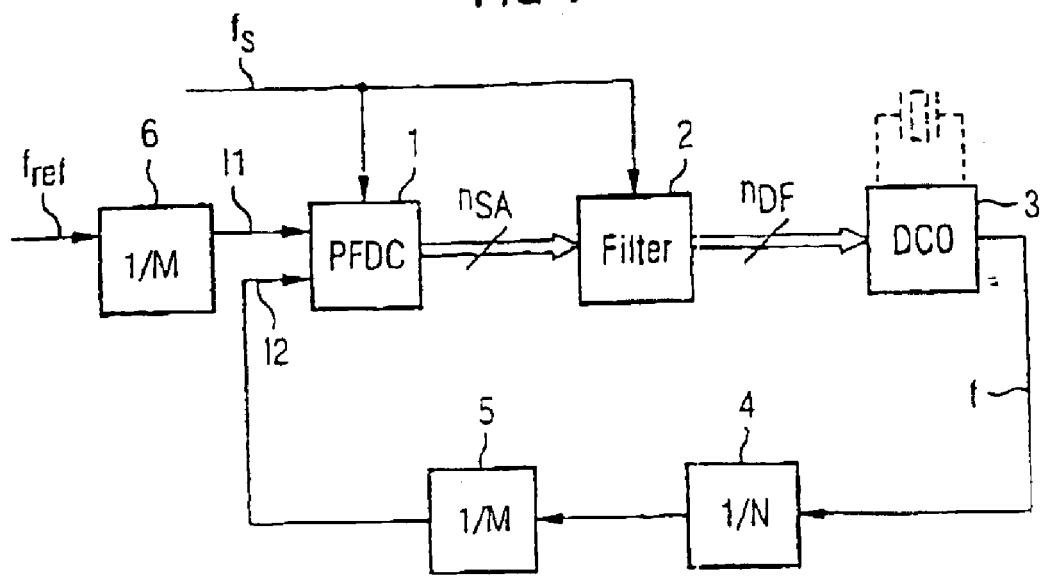
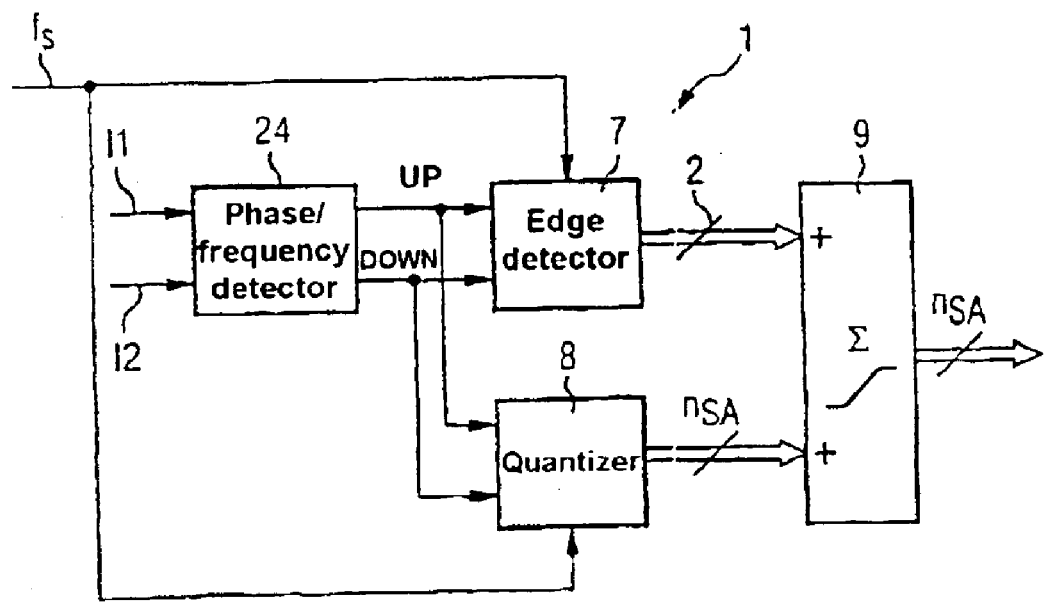

DIGITAL PHASE-LOCKED LOOP

FIELD OF INVENTION

The present invention relates to a digital phase-locked loop for generating a clock signal with the aid of a digitally controlled oscillator (DCO), the clock signal having a defined phase and frequency relationship with a reference clock signal.

BACKGROUND

The present invention relates to a digital phase-locked loop for generating a clock signal with the aid of a digitally controlled oscillator (DCO), the clock signal having a defined phase and frequency relationship with a reference clock signal.

The use of analog phase-locked loops (PLLs) is known for generating frequencies which are synchronized with a specific reference frequency. An analog phase-locked loop of this type is disclosed for example in the document F. M. Gardner, "Charge-Pump Phase-Locked Loops", IEEE Trans. Comm. Vol. 28, pp. 1849–1858, November 1980. This analog phase-locked loop comprises a phase/frequency detector (PFD), which compares the output clock of a voltage-controlled oscillator (VCO) with a reference clock and generates as output signal voltage pulses which contain the information of the phase and frequency difference between the output clock of the voltage-controlled oscillator and the reference clock. The voltage pulses are fed to a charge pump which converts the voltage pulses into corresponding current pulses, these current pulses, for their part, being integrated by a first- or higher-order transimpedance loop filter. Finally, the voltage-controlled oscillator is driven by the output signal of the loop filter in order to set its output clock accordingly. A divider can be arranged in the feedback path between the voltage-controlled oscillator and the phase/frequency detector so that the output clock of the voltage-controlled oscillator divided by a factor N is fed to the phase/frequency detector, where N may be an arbitrary positive number. In the adjusted state of the phase-locked loop, the output frequency of the voltage-controlled oscillator thus corresponds to N times the reference frequency.

If a high frequency resolution with little jitter is demanded, the use of a digitally controlled oscillator (DCO) is advantageous. In this respect, various phase-locked loop architectures have been proposed, the charge pumps and loop filters always having been realized with analog components heretofore.

Thus, by way of example, the document J. Chiang, H. Chen, "A 3.3 all digital phase locked loop with small DCO hardware and fast phase lock", Proceedings of the 1998 IEEE International Symposium on Circuits and Systems, ISCAS '98, Vol. 1, discloses a digital phase-locked loop wherein, instead of the analog phase/frequency detector, a digital phase detector and a digital frequency detector provided separately therefrom are used. The complexity of the overall system is increased as a result. Moreover, the minimum resolution is generally poorer when using digital phase or frequency detectors than when using analog phase or frequency detectors. Furthermore, this document proposes using a control logic of the digitally controlled oscillator which is connected between the digital phase and frequency detectors and the digitally controlled oscillator. Said control logic performs specific control sequences which can be generalized only with considerable effort if at all, so that the digital phase-locked loop described in this document is not suitable for different applications.

U.S. Pat. No. 5,162,746 A also discloses a digital phase-locked loop wherein a digital phase detector is used in combination with an up/down counter and the output signal of the up/down counter is fed via an appropriately configured decoder to a digitally controlled oscillator for the purpose of correspondingly setting its output clock.

A further digital phase-locked loop is described in the document M. Izumikawa, M. Yamashina, "Compact realization of Phase-Locked loop using digital control", IEICE Trans. Electron., Vol. E80-C, No. 4, April 1997, wherein, instead of a digitally controlled oscillator, an analog, voltage-controlled oscillator is used whose output clock is compared with a reference clock by a numerical phase detector. The digital control signal generated by the numerical phase detector is fed via a digital loop filter to a digital/analog converter in order to convert the digital control values into corresponding analog control values for the voltage-controlled oscillator. In this case, the number of digital control values corresponds to the frequency resolution of this phase-locked loop.

The previously proposed architectures for a phase-locked loop with a digitally controlled oscillator make it more difficult to effect a stability analysis of the phase-locked loop, or even make said analysis impossible, since the transfer function of the loop filter respectively used and hence the phase and gain stability limits of the phase-locked loop can be varied only with considerable effort, if at all, by the developer. Thus, the loop filter transfer function best suited to the respectively desired application cannot be chosen freely.

SUMMARY

Therefore, the present invention is based on the object of proposing a digital phase-locked loop with a digitally controlled oscillator which makes it possible to use an arbitrary digital loop filter, so that the developer can always choose the transfer function best suited to the respective application.

In particular, the intention is for the phase detector device to convert the temporally concentrated phase difference information into a phase information item that is distributed over the time axis in the form of a numerical digital control value which can then be integrated in a suitable manner in the digital loop filter.

In order to achieve the object mentioned above, the invention proposes a generally valid structure for a phase-locked loop with a digitally controlled oscillator. The digital phase-locked loop according to the invention comprises a digitally controlled oscillator for generating a specific output clock, a phase detector device for detecting the analog phase difference between the output clock of the digitally controlled oscillator and a reference clock and for converting the analog phase difference thus detected into a corresponding digital control value for the digitally controlled oscillator, and also a digital loop filter via which the digital control value of the phase detector device is fed to the digitally controlled oscillator for the purpose of correspondingly setting its output clock.

The phase detector device of the digital phase-locked loop according to the invention can thus be a phase/frequency analog-to-digital converter (PFDC) which quantizes the phase and frequency information obtained by the comparison of the output clock of the digitally controlled oscillator with the reference clock, in such a way that, unlike in conventional analog charge pump phase-locked loops, it is no longer concentrated in short current or voltage pulses, but rather is converted into a digital control value and distributed uniformly along the time access. The advantage of this solution is that the charge pump can be obviated and the analog loop filter can be replaced by any desired type of a digital loop filter. The developer can thus choose the digital loop filter with the transfer function that is best suited to the respectively desired application. With the aid of the present invention, the entire phase-locked loop can be considered in a traditional manner like an all-analog system and be analyzed in particular with regard to its stability, in which case the phase and gain stability limits can be calculated and varied in a simple manner. The digital loop filter can subsequently be developed with the aid of conventional techniques as a replacement for a time-continuous filter. By way of example, an IIR filter, an FIR filter, a digital wave filter or a bilinear transformation filter, etc. can be used as the digital loop filter.

Overall, the development of the phase-locked loop is thus significantly simplified. The essentially digital design strategy represents a clear advantage since the transfer of the circuit design to smaller chips or more modern technologies is significantly simplified and accelerated and the chip area respectively required can be significantly reduced in particular for the case of very low resonant frequencies.

However, the principle is not restricted to integrated circuits, but rather can also be applied to any desired control loops, e.g. control loops constructed in a discrete fashion.

One or more frequency dividers can be arranged in the feedback path of the phase-locked loop according to the invention. Equally, the reference frequency can be divided down by one or more frequency dividers before it is fed to the phase detector device according to the invention.

The use of a digitally controlled oscillator means that the present invention is suitable, in particular, for all applications of frequency synthesis where a high frequency resolution with little jitter is desired.

The present invention is described in more detail below using a preferred exemplary embodiment with reference to the drawing.

DESCRIPTION OF THE DRAWINGS

FIG. 1 shows a simplified block diagram of a digital phase-locked loop in accordance with a preferred exemplary embodiment of the present invention, FIG. 2 shows the construction of a phase detector device shown in FIG. 1.

DETAILED DESCRIPTION

Figure 3:
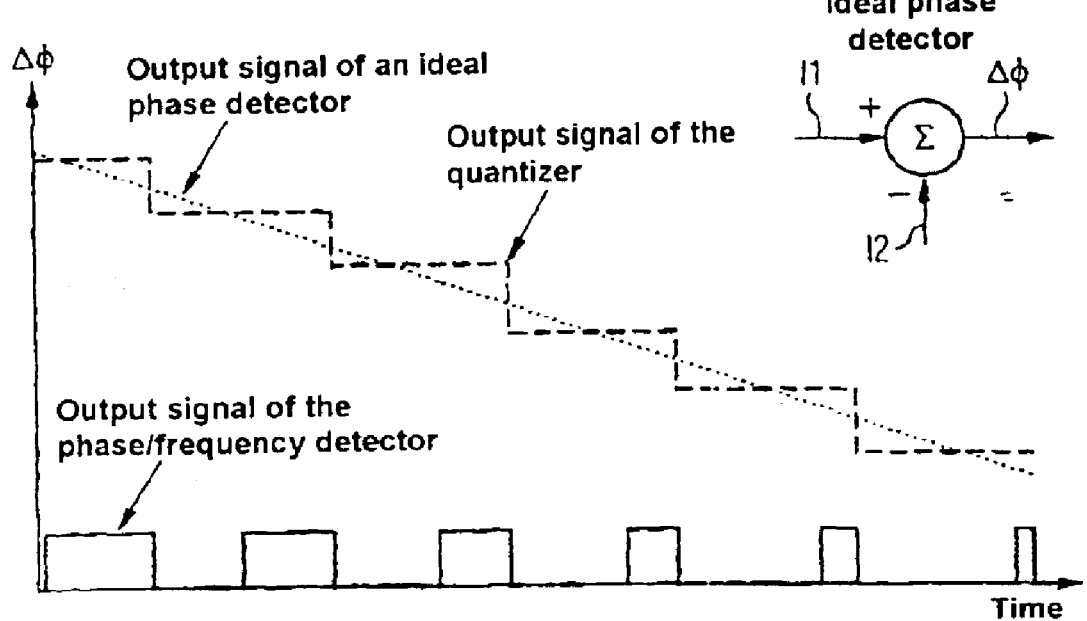
FIG. 3 shows a representation for illustrating the method of operation of the phase detector device shown in FIG. 1 and FIG. 2.

The digital phase-locked loop shown in FIG. 1 comprises, as essential components, a phase/frequency detector device 1 configured as a phase/frequency analog-to-digital converter (PFDC), a matching digital loop filter 2 and a digitally controlled oscillator (DCO). Furthermore, in the exemplary embodiment shown in FIG. 1, a frequency divider 4 is provided in the feedback path, which frequency divider divides the output frequency f of the digitally controlled oscillator 3 by the divider factor 1/N, where N may be an arbitrary positive number. A further frequency divider 5 with the divider factor 1/M may additionally be provided. A further frequency divider 6 with the divider ratio 1/M may also be provided for the reference clock or the reference frequency $f_{ref}$ of the phase detector device 1. The two frequency dividers 5 and 6 are advantageous in particular when the operating clock frequency $f_s$ of the phase detector device 1 and of the digital loop filter 2 is not sufficiently higher than the frequency clock frequency $f_{ref}$.

In the exemplary embodiment shown in FIG. 1 the reference clock $f_{ref}$ is divided down by the frequency divider 6 with the divider factor 1/M and then fed as input signal I1 to the phase detector device 1. The phase detector device 1 receives, as further input signal I2, the output clock f of the digitally controlled oscillator 3, which output clock has previously been divided down by the frequency dividers 4 and 5 with the divider factors 1/N and 1/M, respectively. The phase detector device 1 detects the phase difference between the two input signals I1 and I2, quantizes it in a suitable manner and thus converts the phase difference into a numerical digital control value which is fed to the digital loop filter 2 via a bus having a suitable bus width $n_{SA}$. The architecture of the digital loop filter 2 is completely independent of the configuration of the phase detector 1. The digital output value of the digital loop filter 2 is fed to the digitally controlled oscillator 3 via a further bus having the bus width $n_{DF}$ in order thus to correspondingly set or control its output frequency f directly.

As has already been mentioned, in principle, any desired type of digital filter of any desired order can be used as the digital loop filter 2. Thus, the digital loop filter 2 may be configured for example as an FIR filter ("Finite Impulse Response"), IIR filter ("Infinite Impulse Response") or as a digital wave filter. The concrete configuration of the digital loop filter 2 is left to the respective responsible developer, depending on the stability requirements, the resonant frequency, etc. The digitally controlled oscillator 3, too, can in principle be configured as desired. The sole task of the digitally controlled oscillator 3 is to generate an output frequency f which is proportional to its digital input value. If a high frequency resolution with little jitter is required, the digitally controlled oscillator 3 may be configured as a crystal oscillator, for example.

One possible construction of the phase detector device 1 shown in FIG. 1 is illustrated in detail in FIG. 2. In this case, the phase detector device 1 essentially comprises an analog phase/frequency detector (PFD), an edge detector (ED), a quantizer or sampler (SA) and an arithmetic adder 9, which adds the output values of the edge detector 7 and of the quantizer 8 by means of two's complement addition. In this case, the adder 9 is provided with a limit for preventing an overflow.

The phase/frequency detector 24 is a conventional analog phase/frequency detector which compares the two input signals I1 and I2 with one another and, depending on the phase difference between these two input signals I1 and I2, generates pulsed output signals UP and DOWN, which can assume either a high level (corresponding to the binary value "1") or a low level (corresponding to the binary "0"). The pulse width of the UP and DOWN pulses contains the information about the phase/frequency difference with respect to the input signals I1 and I2. The output signals of the phase/frequency detector 24 are in each case fed to the edge detector 7 and the quantizer 8.

The task of the quantizer 8 is to convert the "temporally concentrated" phase difference information of the phase/frequency detector 24 into a phase difference information item that is "distributed" over the time axis in the form of a numerical digital control value which can then be integrated in a suitable manner in the digital loop filter 2 (cf. FIG. 1).

This means in other words that the combination comprising the phase/frequency detector 24 and the quantizer 8 digitally simulates the behavior of an "ideal" analog phase detector. This also becomes clear from the representation of FIG. 3, which illustrates on the one hand the output signal of an ideal phase detector and on the other hand the output signal of the quantizer 8 and also the output signal of the phase/frequency detector 24 as a function of time. As can be seen from FIG. 3, the output signal of the quantizer 8 can be regarded as a temporally sampled version of the output signal of an ideal phase detector. This concept enables the design of the phase-locked loop to be significantly simplified since the entire phase-locked loop can be considered in a traditional manner as an all-analog system and the digital loop filter 2 can be selected in a simple manner with the aid of conventional techniques. FIG. 3 also reveals how the pulse width of the pulses generated by the phase/frequency detector 24 decreases as the reduction of the phase error $\Delta\phi$ increases.

The quantizer 8 is operated completely synchronously with the digital clock signal $f_s$, so that the minimum phase resolution of the quantizer 8 is defined by the ratio between the reference frequency $f_{ref}$ divided by the divider 6 and the operating frequency $f_s$. If the divider ratio of the dividers 5 and 6 is designated by 1/M and the divider ratio 4 by 1/N and if it is assumed that the operating frequency $f_s$ of the quantizer 8 corresponds to twice the output frequency f of the digitally controlled oscillator 3 (which can be achieved in a simple manner with a small digital circuit), then the minimum phase resolution is defined as follows:

$$\Delta\phi = \frac{1}{2MN}$$

The divider factors M and N can thus be utilized to improve the minimum phase resolution of the quantizer 8. If N=64 and M=8, for example, then the minimum phase resolution $\Delta\phi$=1/1024, which is comparable to the resolution of a 10-bit A/D converter. As will be described in even greater detail below, the range of values of the quantizer 8 is [−2MN+1, 2MN−1], the minimum number of output bits of the quantizer 8 included the sign bit being defined as follows:

$$n_{SA} = \log_2(2MN) + 1$$

The insertion of the additional frequency dividers 5 and 6 reduces the gain of the open phase-locked loop by M. However, this can be compensated for simply by means of a suitable choice of the gain of the digital loop filter 2.

Figure 5:
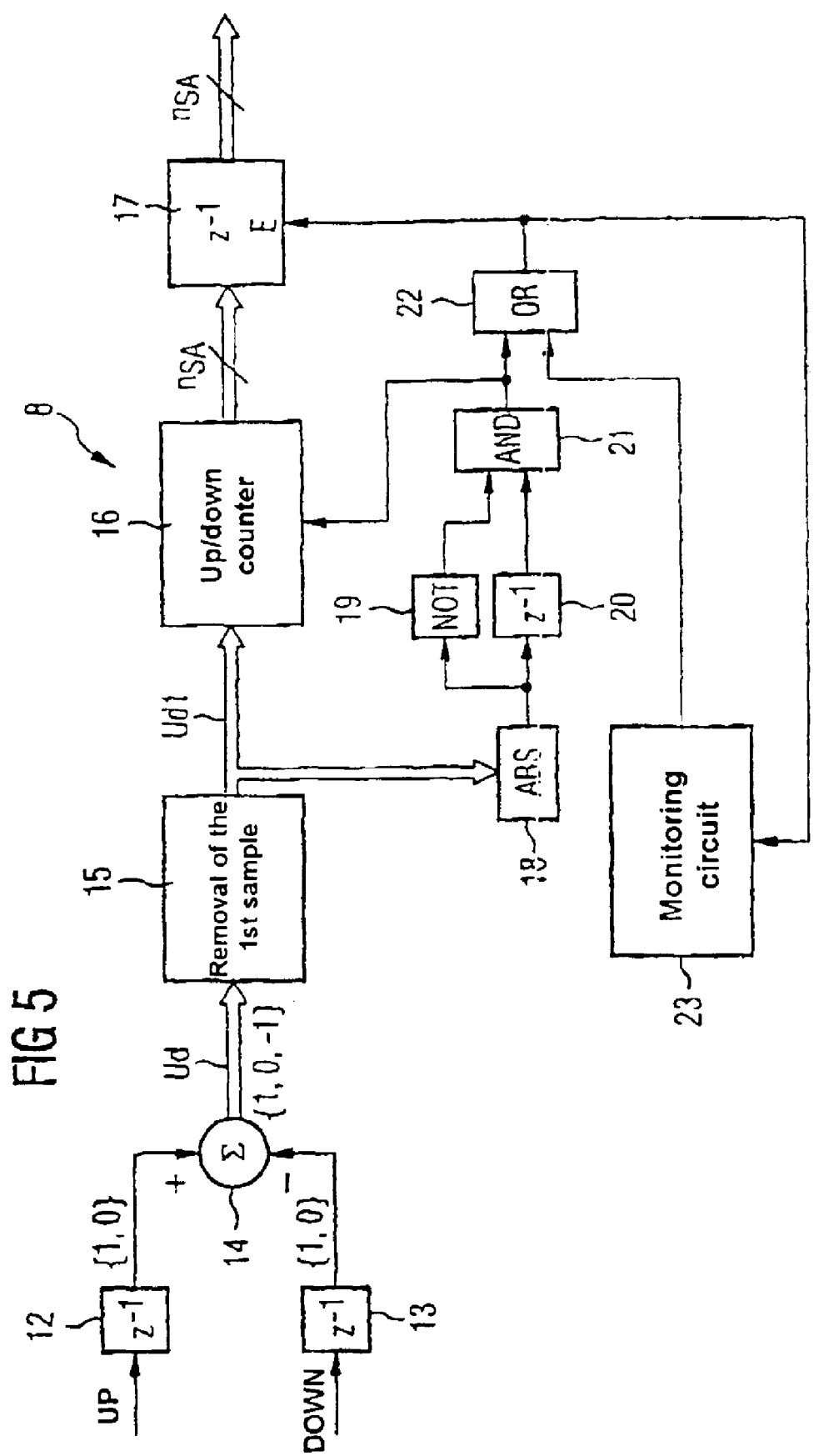
FIG. 5 shows the construction of a quantizer shown in FIG. 2.

The operation of the quantizer 8 will be explained in more detail below with reference to FIG. 5, FIG. 5 illustrating one possible structure of the quantizer 8.

As is shown in FIG. 5, the two output signals UP and DOWN of the phase/frequency detector 24 are sampled with the aid of registers 12 and 13, the respectively mutually corresponding samples of the two signals being subtracted by a subtractor 14 in order to obtain an intermediate signal Ud, which can assume the values 1, 0 and −1. The signal Ud is a pulsed signal whose shape is similar to the shape of the signals UP and DOWN. The pulse length of the individual pulses of the signal Ud is a measure of the phase difference between the two input signals I1 and I2 of the phase/frequency detector 24.

The first sample of each Ud pulse is removed by a simple digital circuit 15, so that the resultant signal Ud1 is fed to the input of an up/down counter 16. The counter 16 alters its counter reading in a manner dependent on the respective value of the signal Ud1, the counter reading being incremented or decremented if the signal Ud1 is positive or negative, respectively, while the counter reading remains unchanged if the signal Ud1 is zero. The output value supplied by this up/down counter 16 at the end of each pulse thus corresponds simply to the signed length of the Ud1 pulses, where the output value of the up/down counter 16 can lie in the range −2MN+1 and 2MN−1.

FIG. 5 also illustrates a circuit section with an absolute value forming unit 18, a logic NOT element 19, a register 20, a logic AND element 21 and a logic OR element 22, the AND element 21 generating a reset pulse whenever a Ud1 pulse is past, and applying to a reset input of the up/down counter 16 in order to reset the counter reading to zero again. Furthermore, an enable pulse is applied to an enable terminal of an output register 17 via the output of the OR element 22 after each Ud1 pulse, so that the final result of the up/down counter 16 is output as the output value. This output value is maintained until a new Ud1 pulse occurs.

FIG. 5 additionally illustrates a monitoring circuit 23 in order to remove the last output value of the quantizer 8 or the up/down counter 16 (in the adjusted state of the phase-locked loop, the signal Ud1 permanently assumes the value zero, so that only the edge detector 7—shown in FIG. 2—of the phase detector device 1 operates, while the state of the quantizer 8 does not change). The monitoring circuit 23 can be realized in a simple manner in the form of a counter which is reset together with the up/down counter 16 and otherwise continuously counts up. If, taking account of an acceptable tolerance limit, the counter reading of this counter 23 exceeds the value 2MN (which means that the signal Ud1 has no pulses), then an enable pulse is generated and the last output value of the register 17 is replaced by the value zero.

If the phase-locked loop is almost in the adjusted state, the phase resolution of the quantizer 8 does not suffice. In this case, the pulses generated by the phase/frequency detector 24 shown in FIG. 2 are so short that they can hardly be sampled by the quantizer 8. Therefore, in accordance with FIG. 2, the circuit block 7 designated as edge detector is provided in order to further improve the phase resolution and thus, in particular, the operation in the adjusted state of the phase-locked loop. One possible construction of the edge detector 7 is illustrated in FIG. 4.

Figure 4:
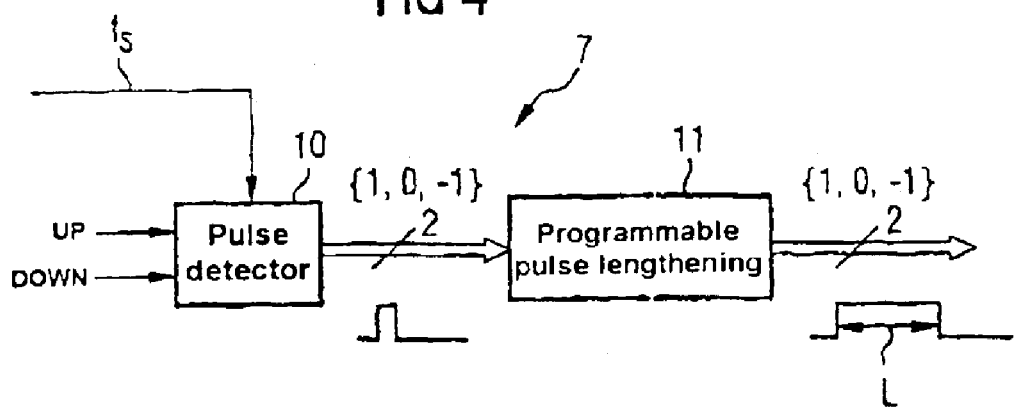
FIG. 4 shows the construction of an edge detector shown in FIG. 2.

As is shown in FIG. 4, the edge detector 7 comprises two circuit blocks 10 and 11. The circuit block 10 designated as pulse detector receives the UP and DOWN pulses of the phase/frequency detector 24 as input signals. Whenever a pulse occurs at one of the inputs of the pulse detector 10, the pulse detector 10 ascertains whether firstly an UP pulse or a DOWN pulse has occurred. The pulse detector 10 then generates an individual pulse whose duration corresponds to the clock period of the digital clock signal $f_s$, this individual pulse assuming the value "1" for example, if an UP pulse first occurred, while the individual pulse assumes the value "−1" if a DOWN pulse first occurred. If no pulse was detected at the inputs of the pulse detector 10, the individual pulse generated by the pulse detector 10 has the value zero. The individual pulse generated by the pulse detector 10 thus contains an item of information about which of the two pulsed signals UP and DOWN leads, and can be used to slightly correct the digital control value fed to the digital loop filter 2.

For this purpose, the individual pulse generated by the pulse detector 10 is expanded to a duration of L clock periods of the digital clock signal $f_s$. The circuit block 11 can be realized by a first-order comb filter, for example. The factor L may be programmable and assume values between 1 and MN. This measure improves the minimum resolution by the factor L/MN, so that the minimum phase resolution is defined as follows:

$$\Delta\phi = \frac{1}{2MN} \cdot \frac{L}{MN}$$

If, by way of example, N=64, M=8 and L=8, then $\Delta\phi$=1/65536 results for the minimum phase resolution, which is comparable to the resolution of a 16-bit A/D converter.

As is shown in FIG. 2, the digital correction value generated by the edge detector 7 in this way is added by the adder 9 to the digital control value generated by the quantizer 9, so that the resultant digital summation value is fed as final control value to the digital loop filter 2 shown in FIG. 1 and then to the digitally controlled oscillator 3 for correspondingly setting the output frequency f thereof.

What is claimed is:

1. A digital phase-locked loop comprising:
   a digitally controlled oscillator for generating an output clock signal;
   a phase detector device for detecting an analog phase difference between a dependent clock, which is digitally dependent on the output clock signal, and a reference clock, the phase detector device converting the detected analog phase difference into a corresponding digital control value for the digitally controlled oscillator, the phase detector device having:
      a phase detector generating a first pulse signal and a second pulse signal dependent on the analog phase difference, a pulse of the first pulse signal being generated if the dependent clock is slower than the reference clock, and a pulse of the second pulse signal being generated if the dependent clock is faster than the reference clock; and
      a quantizing device for converting the information contained in the pulses of the first and second pulse signals for the phase difference into the corresponding digital control value; the quantizing device having
         a first circuit section for sampling the first and second pulse signals and for subtracting the samples of the first and second pulse signals to generate a corresponding digital difference value, and
         a counter whose counter reading is altered in a manner dependent on the respectively generated digital difference value of the first circuit section, the counter reading serving as a basis for the digital control value; and
      a digital loop filter through which the digital control value of the phase detector device connects to the digitally controlled oscillator to set the output clock signal.

2. The phase-locked loop of claim 1, further comprising a frequency divider for connecting the output clock signal to the phase detector device.

3. The phase-locked loop of claim 1, further comprising a frequency divider for connecting the reference clock to the phase detector device via at least one frequency divider.

4. The phase-locked loop of claim 1, wherein the digitally controlled oscillator comprises a crystal oscillator.

5. The phase-locked loop of claim 1, wherein the quantizing device further comprises:
   a second circuit section configured to monitor the digital difference value signal generated by the first circuit section for the end of a pulse and to generate a reset for the counter for resetting the counter reading thereof; and
   an output register through which an instantaneous counter reading of the counter is output, the output register being activated when the reset signal of the second circuit section is present.

6. The phase-locked loop of claim 5, wherein the quantizing device further comprises a third circuit section configured to detect an absence of pulses in the digital difference value signal generated by the first circuit section and to replace a last digital value output by the output register by the value zero.

7. The phase-locked loop of claim 1, wherein the phase detector device further comprises:
   a pulse detector device configured to monitor the occurrence of pulses of the first pulse signal and of the second pulse signal and to generate a digital correction value depending on whether a pulse occurs in the first pulse signal or in the second pulse signal; and
   an addition device for receiving the digital correction value from the pulse detector device, receiving the digital control value from the quantizing device, and adding the digital correction value to the digital output value to generate a resultant digital summation value to be provided to the digital loop filter.

8. The phase-locked loop of claim 7, wherein the pulse detector device is configured to generate the digital correction value in the form of a pulse signal with a programmable pulse length.

* * * * *